United States Patent [19]

Osman

[11] Patent Number: 4,546,273
[45] Date of Patent: Oct. 8, 1985

[54] DYNAMIC RE-PROGRAMMABLE PLA

[75] Inventor: Fazil I. Osman, San Marcos, Calif.

[73] Assignee: Burroughs Corporation, Detroit, Mich.

[21] Appl. No.: 457,176

[22] Filed: Jan. 11, 1983

[51] Int. Cl.[4] ............... H03K 19/177; H03K 19/094; H03K 19/003; H04Q 3/00

[52] U.S. Cl. .................................. 307/468; 307/463; 307/200 B; 364/716; 365/222

[58] Field of Search ............... 307/440, 445, 463, 465, 307/468, 469, 200 B; 364/716; 365/78, 103, 104, 149, 220, 222; 377/54, 64, 69; 340/825.83, 825.87, 825.88, 825.9, 825.91, 825.93

[56] References Cited

U.S. PATENT DOCUMENTS

| | | | |
|---|---|---|---|
| 3,718,915 | 2/1973 | Lattin | 365/222 X |
| 4,037,089 | 7/1977 | Horninger | 364/716 |
| 4,106,108 | 8/1978 | Cislaghi et al. | 365/222 |
| 4,203,159 | 5/1980 | Wanlass | 365/222 |
| 4,366,393 | 12/1982 | Kasuya | 307/445 X |
| 4,415,818 | 11/1983 | Ogawa et al. | 307/465 |
| 4,442,508 | 4/1984 | Knapp et al. | 307/465 X |

Primary Examiner—Larry N. Anagnos
Attorney, Agent, or Firm—Charles J. Fassbender; J. Ronald Richbourg; Kevin R. Peterson

[57] ABSTRACT

A dynamic re-programmable logic array is disclosed which has an AND array disposed for receiving n input signals, an OR array providing k output signals on k output lines and m term lines and m bit lines coupling the AND and OR arrays, wherein the array comprises new and improved random access AND and OR arrays incorporating programmable charge storage elements. Refresh logic is also provided for periodically restoring the charge programmed on the charge storage elements.

11 Claims, 8 Drawing Figures

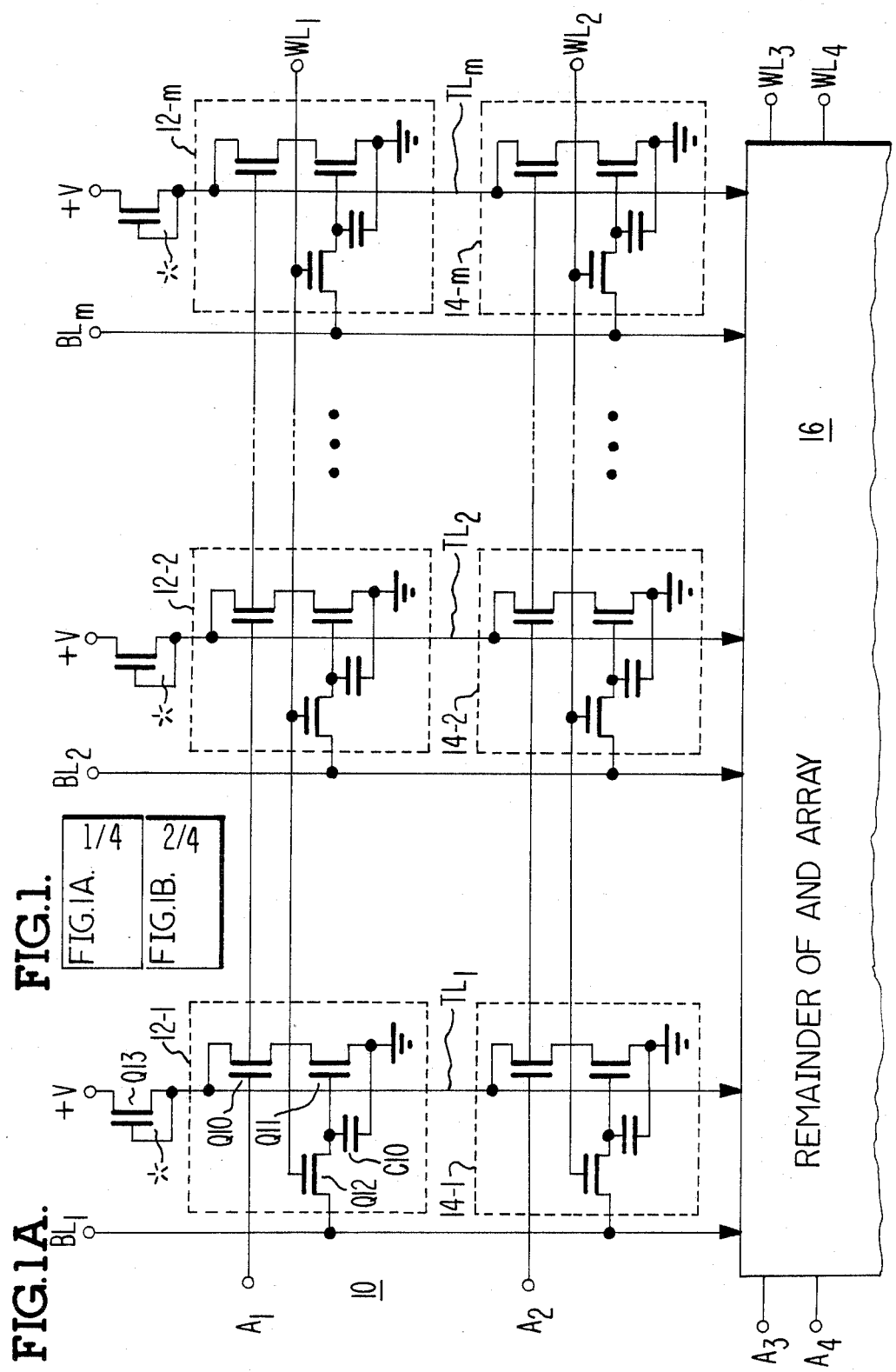

DYNAMIC RE-PROGRAMMABLE PLA

RELATED U.S. PATENT APPLICATIONS

U.S. Patent applications directly or indirectly related to the subject application are the following:

Serial No. 457,175, filed Jan. 11, 1983 by David W. Page and LuVerne R. Peterson and entitled "A Re-programmable PLA", and Serial No. 457,177, filed January 11, 1983 by David W. Page and entitled "A Dynamic Data Re-programmable PLA".

BACKGROUND OF THE INVENTION

This invention relates to programmable logic arrays (PLA's), and more particularly, to PLA's which are readily re-programmable.

In general, a PLA is a logic circuit which receives a plurality of digital input signals and generates a plurality of digital output signals wherein each of the digital output signals is a programmable sum-of-product combination of the input signals. In conventional PLA's, one circuit is provided for generating a plurality of terms which are the logical AND of selected input signals; and another circuit is provided to generate the output signals by selectively ORing the AND terms. A typical PLA may have a total of n input signals, generate a total of m AND terms from the input signals, and generate a total of k output signals by selectively ORing the m AND terms.

An article describing PLA's in more detail is "Field-PLA's Simplify Logic Designs", which was published in *Electronic Design* of September 1, 1975, at pages 84–90. Another series of articles describing PLA's are "Field-programmable Arrays: Powerful Alternatives to Random Logic", *Electronics*, July 5, 1979, pages 109–114; and "Field-programmable Logic, Part 2: Sequencers and Arrays Transform Truth Tables into Working Systems", *Electronics*, July 19, 1979, pages 132–139.

The general design of a PLA includes an AND array feeding into an OR array. The AND array accepts n address inputs which includes an array of terms m deep. Each term is the AND combination of data, or data complement or don't care for each input (don't care is formed by ignoring data and data complement for a given input), hence a typical program may appear as:

term $1 = A \wedge B$
term $2 = \overline{A} \wedge B$
term $m = \overline{B}$

The term lines then feed into an OR array where each term line may be selectively OR'd into an output (the array is $m \times k$ where k is the number of outputs).

The prior art PLA's are typically designed for use in systems requiring permanent or semipermanent nonvolatile logic arrays. PROM's (programmable read only memories) are frequently used to implement logic arrays, which PROM's are usable only once after programming (i.e., the program cannot be changed once made). EPROM's (erasable PROM's) can be changed by the use of an ultraviolet light, which erasure requires several hours to complete. Also, another problem with EPROM's is that they are expensive.

EEPROM's (electrically erasable PROM's), which are even more expensive than EPROM's, require special power supplies. Furthermore, PROM's are not configured as PLA's.

SUMMARY OF THE INVENTION

An advantage of the present invention resides in the provision of a unique design that is readily adaptable to standard MOS (metal oxide semiconductor) fabrication techniques.

Another advantage of this invention is the provision of a PLA design that is readily programmable or re-programmable as required, and requires reduced semiconductor chip area ("real estate").

A programmable logic array is provided which has an AND array disposed for receiving n input signals, an OR array providing k output signals on k output lines and m term lines and m bit lines coupling the AND or OR arrays, wherein the array comprises new and improved random access AND or OR arrays. The AND array includes $n \times m$ cells wherein each cell has first and second transistor means coupled in series between one of the term lines and a reference potential. Each cell includes a charge storage element coupled to the control element of the first transistor means and one of the n input terminals is coupled to the control element of the second transistor means. The OR array includes $m \times k$ cells wherein each cell has third and fourth transistor means coupled in series between one of said output lines and a reference potential. Each of the OR array cells also includes a charge storage element coupled to the control element of the third transistor means and one of the m term lines is coupled to the control element of the fourth transistor means. Refresh logic is coupled to the bit lines for periodically restoring the charge on the charge storage elements.

DETAILED DESCRIPTION OF THE INVENTION

Figure 1B:
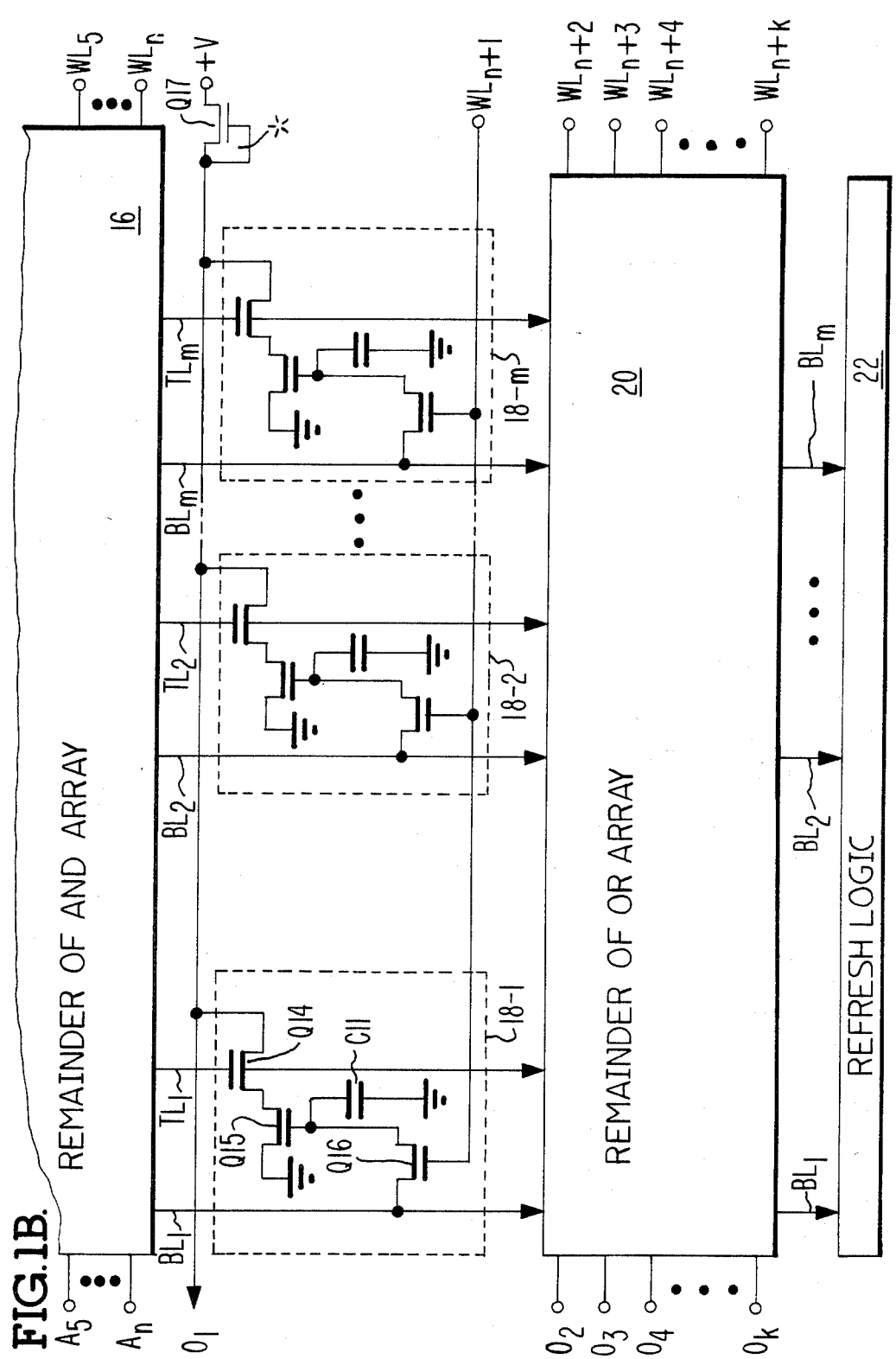
FIG. 1 represents in block form the PLA of this invention; (A) and (B) in schematic diagram disclose the AND and OR arrays and refresh logic of the PLA of this invention.

Referring now to the drawings and in particular to FIG. 1, a programmable logic array (PLA) 10 in accordance with the present invention is illustrated in detail. Programmable elements 12-1, 12-2 ... 12-m each have a first input terminal coupled to an address line $A_1$ and a second input terminal coupled to a word line $WL_1$. In a similar manner, programmable elements 14-1, 14-2 ... 14-m each have a first input terminal coupled to an address line $A_2$ and a second input terminal coupled to a word line $WL_2$. Additional programmable elements are similarly coupled to address lines $A_3, A_4, A_5 ... A_n$ and to word lines $WL_3, WL_4, WL_5 ... WL_n$, which elements are represented by block 16 entitled "Remainder of AND Array". The combination of the elements 12-1, 12-2 ... 12-m, 14-1, 14-2 ... 14-m and those represented by the block 16 form what is referred to herein as an AND array of the PLA 10. Third and fourth input terminals of each of the elements in each column of the AND array are coupled to bit lines $BL_1$, $BL_2$ ... $BL_m$ and term lines $TL_1$, $TL_2$ ... $TL_m$, respectively.

Each of the programmable elements in the AND array are formed of the same structural details. The element 12-1 will be described in detail as respresentative of all such elements in the AND array. The address line $A_1$ is coupled to the gate terminal of a transistor Q10, which transistor has a source terminal coupled to the term line $TL_1$. The drain terminal of the transistor Q10 is coupled to the source terminal of a transistor Q11, and the drain terminal of this transistor is coupled to ground potential. The word line $WL_1$ is coupled to the gate terminal of a transistor Q12, which transistor has a drain terminal coupled to the bit line $BL_1$. The source terminal of the transistor Q12 is coupled to the gate terminal of the transistor Q11. A storage capacitor C10 is coupled between the source terminal of the transistor Q12 and ground potential.

The element 12-1 is programmed when a charge is placed on the capacitor C10 by simultaneously applying a high-level (e.g., five volts) signal on the bit line $BL_1$ and the word line $WL_1$. The charge on the capacitor C10 is applied to the gate terminal of the transistor Q11, which will turn on when the transistor Q10 is turned on by a high-level signal on the address line $A_1$. At this juncture of the description, it should be noted that the term line $TL_1$ is coupled to a voltage supply $+V$ (typically five volts) by means of a depletion transistor Q13 connected as a diode (i.e., the gate terminal is tied to the drain terminal of the transistor). Hence, the term line $TL_1$ is held at a high voltage level until it is "pulled down" by one of the programmable elements. More particularly, if the transistors Q10 and Q11 are both on, the term line $TL_1$ is thereby coupled to ground potential (pulled down). This pulling down of the term line is applied to the OR array, which will be described in greater detail hereinbelow.

The OR array comprises an array of m programmable elements as represented by elements 18-1, 18-2 ... 18-m, and the remaining elements are included in a block 20 entitled "Remainder of OR Array". The element 18-1 will be described as representative of the elements of the OR array. Output line $0_1$ is coupled to input terminals of the elements 18-1, 18-2 ... 18-m, and more specifically, is coupled to the source terminal of a transistor Q14 in the element 18-1. The gate terminal of Q14 is coupled to the term line $TL_1$ and the drain terminal is coupled to the source terminal of a transistor Q15. Word line $WL_{n+1}$ is coupled to second input terminals of the elements 18-1, 18-2 ... 18-m, and more specifically is coupled to the gate terminal of a transistor Q16. The source terminal of the transistor Q16 is coupled to the bit line $BL_1$, and the drain terminal is coupled to the gate terminal of the transistor Q15. A storage capacitor C11 is coupled between the gate terminal of Q15 and ground potential.

The element 18-1 operates in a manner similar to the above-described element 12-1. A charge is placed on the capacitor C11 by simultaneously applying a high-level signal on the bit line $BL_1$ and the word line $WL_{n+1}$. The charge on the capacitor C11 is applied to the gate terminal of the transistor Q15, which will turn on when the transistor Q14 is turned on by a high-level signal present on the term line $TL_1$. The output line $0_1$ is biased at a high level in a manner similar to the term line $TL_1$ by means of a depletion transistor Q17 connected as a diode to the voltage supply $+V$. Thus, if the transistors Q10 and Q11 are both on, as described above, the transistor Q14 would be turned off because the term line $TL_1$ is pulled down to ground potential. In such event, it is irrelevant what charge is present on the capacitor C11 since Q14 is turned off. Hence, in this example, there would be a high level signal on the output line $0_1$.

It should be noted that the bit lines $BL_1$, $BL_2$ ... $BL_m$ are coupled to Refresh Logic 22, which logic is of conventional design. For example, a typical refresh logic suitable for Logic 22 is illustrated and described in an article entitled "Peripheral Circuits for One-Transistor Cell MOS RAM's" by F. C. Foss, at page 255 to 261 of the *IEEE Journal of Solid State Circuits*, Vol. SC-10, No. 5, October, 1975.

Figure 2:
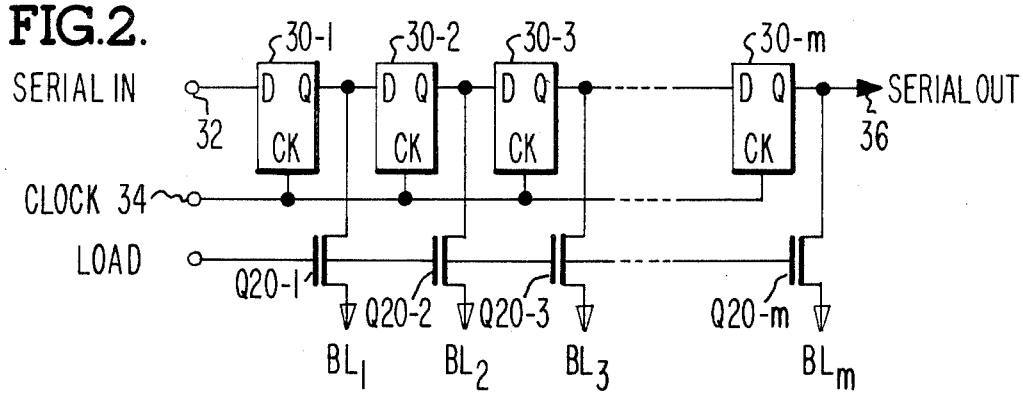
FIG. 2 is a logic-schematic diagram of the program register of the PLA.

Referring now to FIG. 2, a logic-schematic diagram of the program register is illustrated. Programming data is supplied serially on an input terminal 32 also referred to herein as "SERIAL IN", which terminal is coupled to the data ("D") input terminal of a flip-flop 30-1. The output terminal ("Q") of the flip-flop 30-1 is coupled to the data input terminal of another flip-flop 30-2. Additional flip-flops are concatenated together in a conventional manner to form a shift register m units long. The clock (CK) terminals of each of the flip-flops of the shift register are coupled to a CK input terminal 34. The output terminal of the last flip-flop 30-m of the register is coupled to a "SERIAL OUT" output terminal 36.

The output of each of the flip-flops 30-1, 30-2, 30-3 ... 30-m is coupled to a source terminal of each of a series of transistors Q20-1, Q20-2, Q20-3 ... Q20-m, respectively. The gate terminals of all of these transistors are connected together at a "LOAD" input terminal 38, and the drain terminals are coupled respectively to each of the bit lines $BL_1$, $BL_2$, $BL_3$ ... $BL_m$. Hence, when the LOAD signal is at a high level the data in the register are coupled to the bit lines.

Figure 3:
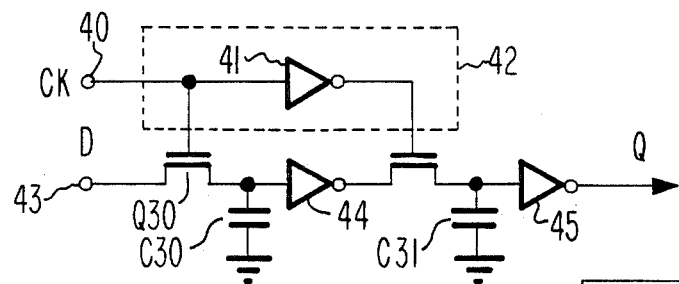
FIG. 3 is a schematic diagram of a typical flip-flop employed in this invention.

Details of the flip-flop elements used herein, such as elements 30-1, etc., are illustrated in FIG. 3. THE CK input terminal 40 is coupled to a master clock having a frequency typically between one and four megahertz. The terminal 40 is coupled to the input of an inverter 41 of a clock circuit 42 and to the gate terminal of a transistor Q30. It is noted that no more than one or two clock circuits such as circuit 40 are employed for the entire PLA. The data "D" input terminal 43 is coupled to the source terminal of Q30, and the drain terminal thereof is coupled to the input of an inverter 44 and one side of a capacitor C30. The capacitor C30 is a parasitic capacitor having the other side coupled to ground potential.

The output of the inverter 44 is coupled to the source terminal of a transistor Q31, and the output of the inverter 41 is coupled to the gate terminal of the same Q31. The drain terminal of the transistor Q31 is coupled to the input of an inverter 45 and to one side of a capacitor C31. The capacitor C31 is a parasitic capacitor having the other side coupled to ground potential. The output of the inverter 45 is coupled to a node Q, which is the output terminal of the flip-flop element.

In operation, a potential (e.g., high-level signal) applied on the terminal 43 is transferred to the input of the inverter 44 by the clock signal applied to the terminal 40 going to a high level. This potential is stored by the capacitor C30. When the CK signal drops to a low level, the output of the inverter 41 goes to a high level and the potential on C30 inverted by the inverter 44 is transferred to the capacitor C31 through Q31. The inversion of this potential (now in phase with that on the node D) is supplied at the output node Q.

Figure 4:
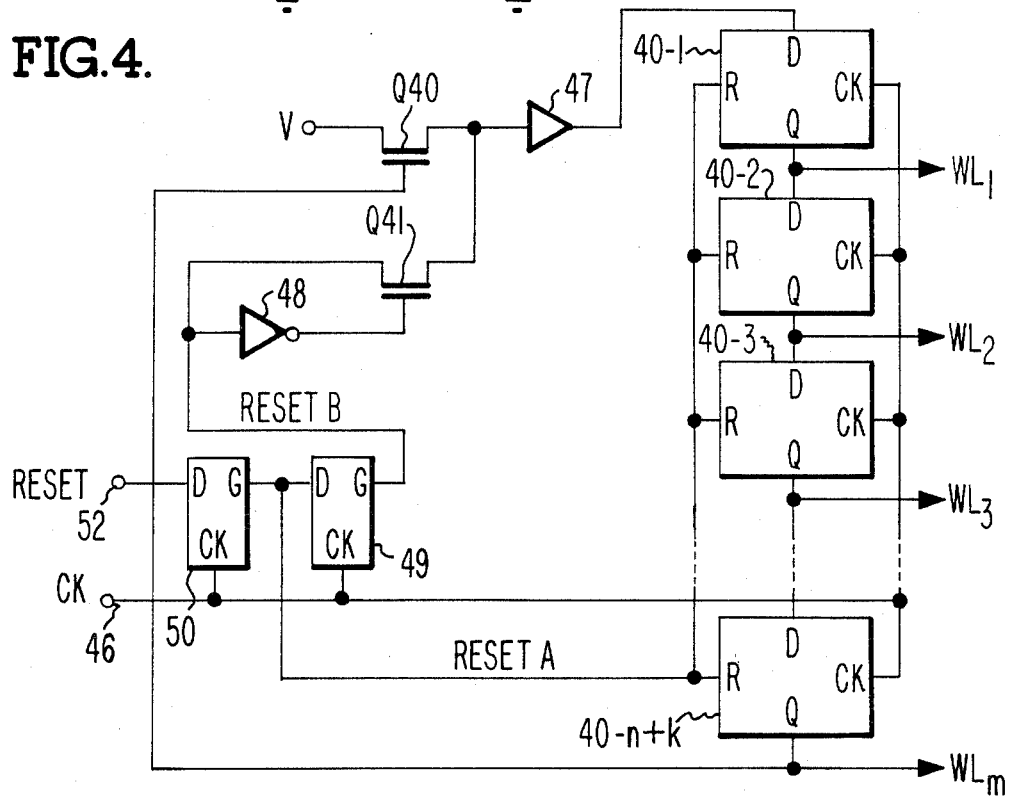
FIG. 4 is a logic-schematic diagram of the refresh register of the PLA.

Referring now to FIG. 4, a logic-schematic diagram of the refresh register and related circuitry is illustrated. The refresh register comprises a series of flip-flops 40-1, 40-2, 40-3 . . . 40-n+k. The outputs of the flip-flops of the refresh register are coupled to the word lines (WL$_1$, WL$_2$, WL$_3$ . . . WL$_{n+k}$). The clock input terminals of these flip-flops are coupled to a CK input terminal 46.

The data ("D") input terminal of the first flip-flop in the series register (i.e., flip-flop 40-1) is coupled to the output of a non-inverting buffer 47, which has a single input terminal coupled to the drain terminals of a pair of transistors Q40 and Q41. The gate terminal of the transistor Q40 is coupled to the input of an inverter 48 and to the output terminal of a flip-flop 49. The output of the inverter 48 is coupled to the gate terminal of the transistor Q41. The data input terminal of the flip-flop 49 is coupled to the output terminal of a flip-flop 50. The data input terminal of the flip-flop 50 is coupled to a RESET input terminal 52. The clock input terminals of the flip-flops 49 and 50 are coupled to the CK input terminal 46.

The source terminal of the transistor Q40 is coupled to a voltage supply +V, and the source terminal of the transistor Q41 is coupled to the output terminal of the last flip-flop in the refresh register (i.e., flip-flop 40-n+k). The output of the flip-flop 50, which is referred to herein as "RESET A", is coupled to the reset "R" input terminal of each of the flip-flops 40-1, 40-2, 40-3 . . . 40-n+k. When a RESET signal is applied to the terminal 52, the flip-flop 50 is set on the next subsequent clock cycle. Thus, the RESET A signal is supplied to the flip-flops 40-1, 40-2, 40-3 . . . 40-n+k, which thereby resets, or restores, the refresh register to a zero state. It is assumed for discussions herein that a high level voltage (e.g., +5 volts) is a logic one and a lower voltage (e.g., 0 volts) is a logic zero.

On the next subsequent clock cycle the flip-flop 49 is set, which provides a "RESET B" signal to the input of the inverter 48 (which causes the transistor Q41 to turn off) and to the gate terminal of the transistor Q40. The transistor Q40 turns on and the +V potential (i.e., a logic one) is applied to the data ("D") input terminal of the flip-flop 40-1. On the next clock cycle the logic one is clocked to the flip-flop 40-2, and on the next subsequent clock cycle the same logic one is clocked into the flip-flop 40-3, and so on and so forth. When the logic one is stored in the flip-flop 40-n+k, it is recirculated back to the flip-flop 40-1 by means of the transistor Q41 and the buffer 47. The logic one that is being circulated through the refresh register is used to sequentially raise each of the word lines to a high level, which operates in conjunction with the refresh logic 22 to restore the charge programmed on the storage capacitors.

When the RESET B signal was generated by setting the flip-flop 49, the RESET A signal goes to zero on the clock cycle that set the flip-flop 49. On the next following clock cycle, the flip-flops 49 and 50 are both reset and the RESET A and RESET B signals are both at a logic zero. Accordingly, the input to the inverter 48 is at a low level, the output thereof is at a high level and the transistor Q41 is turned on. Hence, when the recirculating logic one was applied to the source terminal of the transistor Q41 it was passed therethrough to the input of the flip-flop 40-1.

Figure 5:
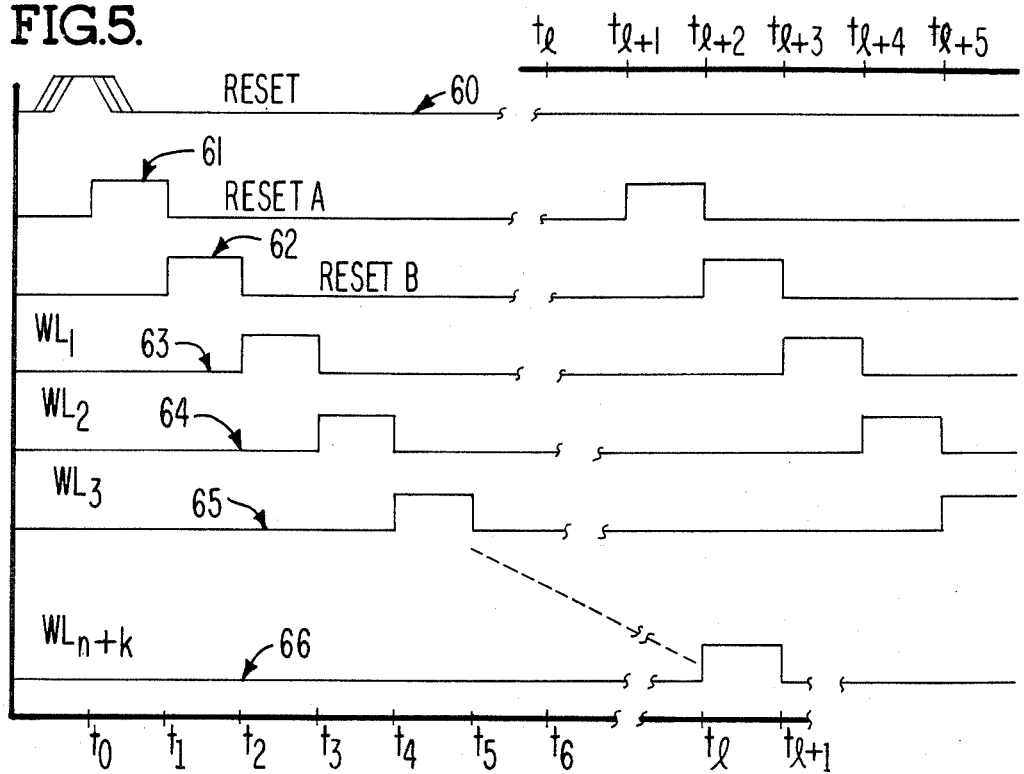
FIG. 5 is a timing diagram illustrating operation of the PLA.

The operation of the refresh register shown in FIG. 4 can be more fully understood by referring to the timing diagram illustrated in FIG. 5. Waveform 60 represents a RESET signal that is applied on the terminal 52; waveform 61 represents the RESET A signal appearing at the output of the flip-flop 50; and, waveform 62 represents the RESET B signal appearing at the output of the flip-flop 49. Waveforms 63, 64, 65 . . . 66 represent the logic one that is being circulated through the refresh register.

Figure 6:
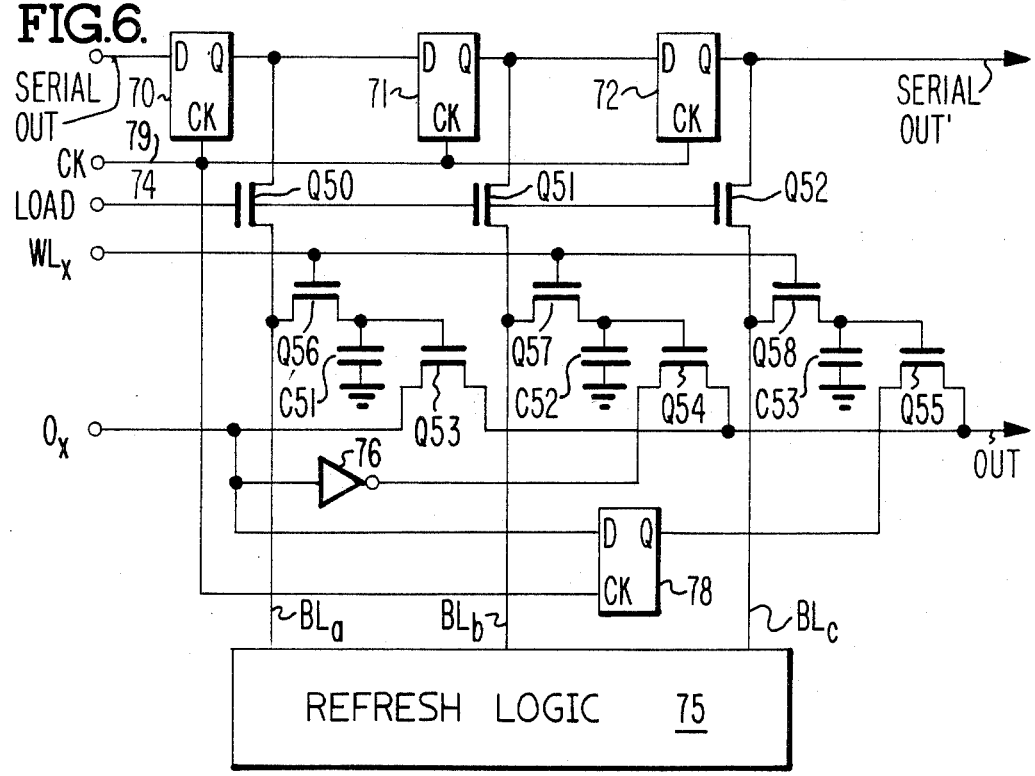
FIG. 6 is a logic-schematic diagram of a program output circuit of the PLA.

The output of the PLA 10 can be programmed to be inverted, non-inverted or latched by use of program output circuits, one of which is illustrated in FIG. 6. A register is employed for storing the output program, which as shown in FIG. 5 comprises flip-flops 70, 71 and 72. The register input is the "SERIAL OUT" signal from terminal 36 (FIG. 2) which is coupled to the data ("D") input terminal of the flip-flop 70. The outputs of the flip-flops 70, 71 and 72 are coupled to the source terminals of transistors Q50, Q51 and Q52. The gate terminals of these transistors are coupled to a LOAD input terminal 74; and the drain terminals are coupled to bit lines BL$_a$, BL$_b$ and BL$_c$, respectively, which bit lines are coupled to refresh logic 75.

A typical output line O$_x$ is coupled to the source terminal of a transistor Q53, the input terminal of an inverter 76 and the data ("D") input terminal of a flip-flop 78. The clock input terminals of the flip-flops 70, 71, 72 and 78 are coupled to the clock CK input terminal 79. The output terminal of the inverter 76 is coupled to the source terminal of a transistor Q54 and the output terminal of the flip-flop 78 is coupled to the source terminal of a transistor Q55. The drain terminals of the transistors Q53, Q54 and Q55 are connected together and this connection is coupled to the programmed output "OUT".

Each of the transistors Q53, Q54 and Q55 are switched on and off by program elements similar to the element 18-1 (FIG. 1) described above. For example, the gate terminal of the transistor Q53 is coupled to the drain terminal of a transistor Q56 having a gate terminal coupled to a word line WL$_x$ and a source terminal coupled to the bit line BL$_a$. A capacitor C51 is coupled between the gate terminal of Q53 and ground for storing a charge. Likewise, the gate terminal of Q54 is coupled to the source terminal of a transistor Q57 having a gate terminal coupled to the word line WL$_x$ and a drain terminal coupled to the bit line BL$_b$. A capacitor C52 is coupled between the gate terminal of Q54 and ground potential. The gate terminal of Q55 is coupled to the source terminal Q58 having a gate terminal coupled to the word line WL$_x$ and a drain terminal coupled to the bit line BL$_c$. A capacitor C53 is coupled between the gate terminal of Q55 and ground potential.

The operation of this circuit is similar to that described above with reference to the element 18-1 (FIG. 1). Assume the flip-flop 70 is set and flip-flops 71 and 72 are reset. Thus, if the LOAD signal is at a high level, bit line BL$_a$ is at a high level while bit lines BL$_b$ and BL$_c$ are at a low level. If a high-level signal is supplied on the word line WL$_x$ at this time, the transistor Q56 will turn on and a charge will be placed on the capacitor C51. Hence, the transistor Q53 will be on and the transistors Q54 and Q55 will be off (bit lines BL$_b$ and BL$_c$ were at a low level). Therefore, the output signal appearing on O$_x$ will be transferred through Q53 to the output OUT. If the flip-flop 71 is set and 70 and 72 are reset, the output appearing on O$_x$ will be inverted by the inverter 76 and transmitted through Q54. (Q54 is on since flip-flop 71 is set) to the output OUT. In a similar manner, if the flip-flops 70 and 71 are reset and the flip-flop 72 is set, the signal appearing on $O_x$ will be latched by the flip-flop 78 on the next clock cycle, and the output thereof will be transmitted through Q55 to the output OUT.

It may be appreciated from the description above that a dynamic re-programmable logic array has been described in detail. Thus, while the invention has been particularly shown and described in detail with reference to only one embodiment, it will be understood by those skilled in the art that the foregoing and other changes in form and details may be made without departing from the spirit and scope of the invention. Accordingly, it is intended that the present invention only be limited by the appended claims.

What is claimed is:

1. A programmable logic array having and AND array disposed for receiving n input signals, an OR array providing k output signals on k output lines, and m term lines and m bit lines coupling said AND and OR arrays, wherein n, m, and k are integers greater than one, said array comprising:
   a. AND array having n×m cells wherein each cell comprises:
      (i) first and second transistor means coupled in series between one of said term lines and a reference potential, each of said transistor means having a control element;
      (ii) a first charge storage element coupled to the control element of said first transistor means;
      (iii) one of said n input terminals being coupled to the control element of said second transistor means;
   b. OR array having m×k cells wherein each cell comprises:
      (i) third and fourth transistor means coupled in series between one of said output lines and a reference potential, each of said transistor means having a control element;
      (ii) a second charge storage element coupled to the control element of said third transistor means;
      (iii) one of said m term lines being coupled to the control element of said fourth transistor means;
   c. refresh logic means coupled between said bit lines and said first and second charge storage elements; and
   d. said refresh logic means including word lines which operate to selectively couple charge from said bit lines onto said charge storage elements.

2. A programmable logic array as in claim 1 further characterized by said transistor means being MOS field effect transistors.

3. A programmable logic array as in claim 1 further characterized by said charge storage elements being parasitic capacitance.

4. A programmable logic array as in claim 1 further characterized by a program shift register having m data storage elements wherein an output of each of said data storage elements is coupled to respective ones of said bit lines.

5. A programmable logic array as in claim 1 further characterized by a refresh register having n+k data storage elements wherein n output terminals of the first n elements of said register are coupled to respective ones of said AND array word lines and k output terminals of the next k elements of said register are coupled to respective ones of said OR array word lines.

6. A programmable logic array as in claim 1 further characterized by a program output circuit being coupled to each of said k output lines.

7. A programmable logic array as in claim 6 further characterized by said program output circuit including a shift register having multiple data storage elements, said storage elements having output terminals coupled to respective program cells wherein each of said cells controls different states of said output lines.

8. A programmable logic array as in claim 7 further characterized by each of said program cells in said program output circuit including a transistor means having an input terminal coupled to one of said output lines, an output terminal coupled to an output terminal of said program output circuit and a control element coupled to a charge storage element and to said output terminal of one of said data storage elements.

9. A programmable logic array as in claim 8 further characterized by said program output circuit including an inverter coupled between said output line and said input terminal of said transistor means, whereby the output signal from said array is inverted.

10. A programmable logic array as in claim 8 further characterized by said program circuit including a flip-flop latch circuit coupled between said output line and said input terminal of said transistor means, whereby the output signal from said array is latched.

11. A dynamic re-programmable logic array comprising an AND array disposed for receiving n input signals, an OR array providing k output signals on k output lines, and m term lines and m bit lines coupling the AND and OR arrays; wherein the AND and OR arrays incorporate arrays of programmable charge storage means which store charge from the bit lines, and in response thereto, AND the input signals onto the term lines and OR the term line signals onto the output lines, and wherein refresh logic means is also provided for periodically restoring the charge programmed on the charge storage means.

* * * * *